United States Patent
Fairbairn et al.

(10) Patent No.: US 6,176,667 B1
(45) Date of Patent: *Jan. 23, 2001

(54) MULTIDECK WAFER PROCESSING SYSTEM

(75) Inventors: Kevin Fairbairn, Saratoga; Ashok Sinha, Palo Alto, both of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/644,636

(22) Filed: Apr. 30, 1996

(51) Int. Cl.$^7$ ................................................ B65G 49/07
(52) U.S. Cl. .................. 414/217; 414/226.01; 414/937; 414/939; 414/941
(58) Field of Search ........................... 414/217, 222, 414/939, 786, 226.01, 941, 937; 204/298.25, 298.35; 118/719; 156/395

(56) References Cited

U.S. PATENT DOCUMENTS

| | | | |
|---|---|---|---|
| 4,113,547 | 9/1978 | Katz et al. ........................... | 156/612 |
| 4,530,750 * | 7/1985 | Aiserberg et al. .................... | 156/345 |
| 4,927,484 * | 5/1990 | Mitomi ................................ | 156/345 |
| 4,951,601 | 8/1990 | Maydan et al. ....................... | 118/719 |
| 5,001,594 | 3/1991 | Bobbio ................................ | 361/234 |
| 5,037,262 | 8/1991 | Moll et al. ........................... | 414/222 |
| 5,099,571 | 3/1992 | Logan et al. .......................... | 29/825 |
| 5,158,644 | 10/1992 | Cheung et al. ....................... | 156/643 |
| 5,166,856 | 11/1992 | Liproace et al. ..................... | 361/233 |
| 5,195,862 * | 3/1993 | Cruz ..................................... | 414/416 |
| 5,202,716 * | 4/1993 | Tateyama et al. ............... | 414/217 X |
| 5,275,709 * | 1/1994 | Anderle et al. ............. | 204/298.35 X |
| 5,292,554 | 3/1994 | Sinha et al. ........................... | 427/251 |
| 5,297,910 * | 3/1994 | Yoshioka et al. ................ | 414/225.01 |
| 5,303,671 * | 4/1994 | Kondo et al. ..................... | 414/939 X |
| 5,310,410 * | 5/1994 | Begin et al. ................. | 204/298.35 X |
| 5,315,473 | 5/1994 | Collins et al. ........................ | 361/234 |
| 5,325,261 | 6/1994 | Horwitz ................................ | 361/234 |
| 5,364,222 * | 11/1994 | Akimoto et al. ................. | 414/225.01 |
| 5,382,803 | 1/1995 | Asakawa ........................... | 250/492.21 |
| 5,388,944 * | 2/1995 | Takanabe et al. ............... | 414/939 X |
| 5,427,620 | 6/1995 | deBoer et al. ....................... | 118/725 |
| 5,431,737 | 7/1995 | Keller et al. .......................... | 118/729 |
| 5,452,510 | 9/1995 | Barnes et al. ......................... | 29/825 |
| 5,460,703 | 10/1995 | Nulman et al. .................. | 204/192.12 |
| 5,462,397 * | 10/1995 | Iwabuchi .......................... | 414/939 X |
| 5,463,525 | 10/1995 | Barnes et al. ........................ | 361/234 |
| 5,486,975 | 1/1996 | Shamouilian et al. ............... | 361/234 |
| 5,491,603 | 2/1996 | Birang et al. ......................... | 361/234 |
| 5,515,986 * | 5/1996 | Turlot et al. ......................... | 156/345 |
| 5,521,790 | 5/1996 | Ruckel et al. ......................... | 361/234 |
| 5,611,655 * | 3/1997 | Fukasawa et al. ............... | 414/939 X |
| 5,613,821 * | 3/1997 | Muka et al. ...................... | 414/939 X |
| 5,639,301 * | 6/1997 | Sasada et al. .................... | 414/937 X |
| 5,663,884 * | 9/1997 | Nishihata et al. ............... | 414/939 X |
| 5,711,646 * | 1/1998 | Ueda et al. ........................... | 414/225 |
| 5,762,745 * | 6/1998 | Hirose .............................. | 414/217 X |
| 5,826,129 * | 10/1998 | Hasebe et al. .................... | 414/416 X |

FOREIGN PATENT DOCUMENTS

| | | | |
|---|---|---|---|
| 123430 * | 4/1992 | (JP) ..................................... | 414/939 |
| 4-240721 * | 8/1992 | (JP) . | |
| 6-104326 * | 4/1994 | (JP) . | |

* cited by examiner

Primary Examiner—Steven A. Bratlie
(74) Attorney, Agent, or Firm—Townsend, Townsend & Crew

(57) ABSTRACT

A multideck wafer processing system is described for the treatment of semiconductor wafers. The system includes at least two process chambers stacked one above the other to provide for higher wafer throughput per unit area of cleanroom space. The stacked process chambers enable sharing of pressurization, gas, electrical, and control support services for the processing chambers.

44 Claims, 4 Drawing Sheets

MULTIDECK WAFER PROCESSING SYSTEM

BACKGROUND OF THE INVENTION

This invention relates to equipment for processing semiconductor wafers, and in particular to a method and apparatus for processing two or more wafers at the same time in two or more vertically arranged processing chambers.

Numerous techniques and apparatus are well known for use in the processing of semiconductor wafers to make integrated circuits. The state of the art fabrication facilities (known as "fabs") for carrying out such processes are typically large buildings within which "clean rooms" of thousands of square feet of floor area are provided. The clean rooms contain the equipment within which the various semiconductor fabrication processes are carried out, for example, chemical vapor deposition equipment for deposition of conductive or insulative materials on the wafers, ion implantation equipment for introduction of impurities into the wafers, furnaces for heating the wafers, plasma etchers for removing material from the wafers, etc.

Compared even to their recent predecessors, clean rooms today are extraordinarily clean, often having particle densities of less than class 1. Such low particle densities require expensive equipment to purify the air in the clean room, as well as unusual care in all other respects. The result of these measures is that floor space in such clean rooms is expensive. The per-square-foot construction cost, as well as maintenance cost, is high.

Another trend in the manufacture of integrated circuits is the use of single wafer processing equipment. In single wafer equipment, processing is carried out on the wafers one wafer at a time. That is, one wafer is introduced from a cassette holding many wafers into the processing chamber. The necessary process on the wafer is carried out in the chamber, then the wafer is removed from the chamber and the next wafer introduced. Typically, such single wafer processing chambers are clustered around a central robot which can load the chambers with individual wafers. The use of single wafer processing provides higher yields by making the process more controllable across the entire wafer, typically 8 inches in diameter, with 12 inches in the near future. The higher yields produced by single wafer systems have resulted in their use in many of the advanced fabrication facilities used today in the semiconductor industry.

SUMMARY OF THE INVENTION

This invention enables the use of single or multiple wafer process chambers, yet increases the throughput of such systems per unit area of clean room space consumed by the equipment, and at a lower capital cost per wafer processed. This is achieved by stacking the process chambers one above another vertically. By transferring two (or more) wafers at a time from a wafer storing cassette or other means, the vertically arranged process chambers can be operated simultaneously, thereby increasing the number of wafers processed per unit time per unit area of clean room space. This lowers the capital cost per wafer processed, while increasing the utilization of clean room space.

In a preferred embodiment the system of this invention includes a wafer storage mechanism for storing a group of wafers, at least one set of processing chambers having at least two chambers stacked one above the other, and a wafer transfer chamber for moving wafers from the wafer storage mechanism to the at least two chambers.

In another embodiment of the invention, a method for processing more than one wafer simultaneously consists of the steps of providing at least two wafer processing chambers, one disposed above the other, storing a plurality of wafers in a wafer storage mechanism, removing at least two wafers from the wafer storage mechanism, placing each of the at least two wafers in a corresponding process chamber, performing a process on the wafers to change their condition, removing at least one of the at least two wafers from its corresponding process chamber, and returning the wafers removed in the preceding step to the wafer storage mechanism. In either embodiment the wafer storage mechanism itself can be supplied with wafers from a wafer cassette using a second robot, if desired.

DESCRIPTION OF THE SPECIFIC EMBODIMENTS

Figure 1:
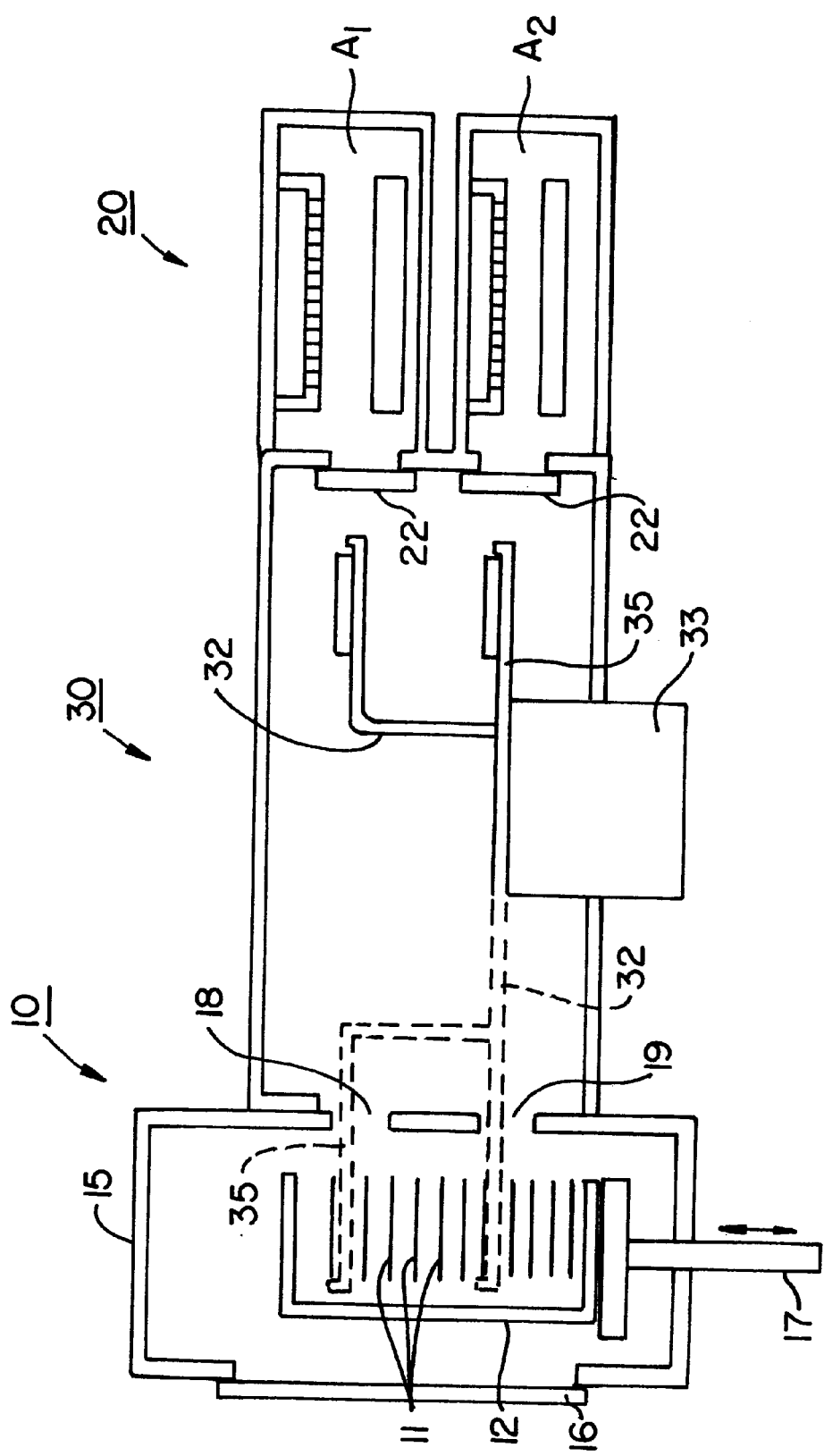
FIG. 1 is a cross-sectional view of a multideck wafer processing system.

FIG. 1 is a cross-sectional view of a multideck wafer processing system. The system shown in FIG. 1 includes a wafer storage mechanism 10 in which a group of wafers is stored, typically on the order of 4 to 100 wafers. Also shown in FIG. 1 are a pair of wafer processing chambers situated generally in region 20. Importantly, as will be discussed below, the pair of processing chambers is disposed one above the other. Each chamber provides the capability of processing one or more wafers therein. Between the wafer processing chambers 20 and the wafer storage mechanism 10 is positioned a wafer transfer chamber 30. Wafer transfer chamber 30 is adapted to transfer wafers from the storage mechanism 10 and place those wafers in the processing chambers 20. Each of these elements of the system is discussed in further detail below.

In the fabrication of integrated circuits using silicon wafers, or other type semiconductor wafers, the wafers typically are provided to the processing apparatus in a wafer cassette 12. Wafer cassette 12 is usually a plastic, metal, or ceramic material in which the wafers are positioned in slots adjoining each other. Each slot includes protrusions to maintain each wafer in a separate spaced apart position from the adjoining wafers. A loadlock 15 typically includes an openable door 16 and an elevator 17 upon which the cassette rides. The loadlock also includes additional openings 18 and 19 on one side thereof. These openings enable a robot arm 32 to reach into the cassette and remove wafers 11.

In operation, a cassette 12 is placed in the loadlock 15 and door 16 closed. At this time doors 18 and 19 also will be closed. Tubing, or other suitable interconnection piping, couples the loadlock 15 to a vacuum pump (shown in FIG. 3). After the cassette is introduced and the door 16 closed, the vacuum pump is engaged and the pressure within the loadlock reduced to a pressure corresponding to that in the wafer transfer chamber 30. The doors over openings 18 and 19 then are opened to enable the robot arm 32 to extract wafers from the cassette 12. The remainder of the semiconductor fabrication operation is then carried out without the need for reopening the loadlock. Once the entire cassette of wafers has been processed, the loadlock is vented to atmospheric pressure; door 16 is opened; the completed cassette is removed; and a new cassette is introduced. In other embodiments the system described can be employed to perform processes at atmospheric pressure, or at higher than atmospheric pressures. In such cases the vacuum pump may be replaced by other pumps which provide the desired process pressure.

As mentioned, also coupled to the wafer transfer chamber 30 are a series of processing chambers 20. These processing chambers are shown on the right-hand side of FIG. 1 and are designated chamber $A_1$ and chamber $A_2$. Although only two vertically arranged processing chambers are shown in FIG. 1, it should be appreciated that as many as desired may be stacked vertically. For example, described below is an embodiment in which three vertically arranged processing chambers are provided.

In the preferred embodiment, each of the processing chambers is adapted to carry out a specific semiconductor processing operation, or a set of processing operations. For example, the semiconductor processing chambers may be used to perform a chemical vapor deposition operation in which insulating or conductive material is deposited on the wafer. Another well known semiconductor processing chamber is used for etching of the wafers, typically through openings in a photoresist masking layer. Of course, any suitable semiconductor operation can be performed in these chambers, such as plasma vapor deposition, epitaxial layer deposition, etc. As will be described, the choice of such operation is arbitrary within the context of the system described herein. For illustration of a typical process, the chambers depicted in FIG. 1 include schematic illustrations of a "showerhead" used for chemical vapor deposition, and a wafer heater, upon which the wafer is positioned for processing.

Between the vertically arranged wafer processing chambers 20 and the loadlock 15, the wafer transfer chamber 30 is provided. The wafer transfer chamber includes a robot 33 which moves an arm 32 among a series of desired positions. In FIG. 1 the arm is shown in two different positions. In the first position on the left-hand side of the figure, the arm is in position to extract two wafers 11 from the cassette 12. (In embodiments where more than one wafer per chamber are processed, the robot may handle multiple wafers in one, or a few, procedures.) Support fingers 35 extend from the arm 32 beneath the wafers. These fingers have been inserted into the gap between the adjoining wafers, and the robot arm lifted slightly to the point where the weight of the wafers bears on the support fingers of the arm.

As the operation continues, the arm will move to a second position, shown generally on the right-hand side of the wafer transfer chamber 30. The wafers are placed in the second position by activation of the robot 33 which moves the arm 32 and support fingers 35 into the desired position. In this position the wafers are resting on the support fingers. This is in preparation for the two slit valves 22 to be opened to permit the wafers to be moved into the processing chambers. Because the loadlock and the wafer transfer chamber are maintained at essentially the same pressure, minimal or no use of the vacuum pump for the transfer operation is needed.

Once the wafers are in the position shown on the right-hand side of the wafer transfer chamber 30, the slit valves 22 may be opened and the wafers inserted into the processing chambers, again using the robot 33. If the chambers are single wafer chambers, a desired process is then carried out on the wafers. On the other hand, if either or both chambers is designed for handling more than one wafer at a time, then additional wafers are inserted and the desired process carried out. Ultimately the wafers are removed from the processing chambers and returned to the cassette. Another set of wafers is then removed from the cassette and inserted into the processing chambers. This process is repeated until all of the wafers in the cassette have been processed, and then a new cassette is introduced and the process repeated again. Of course, if multiple loadlocks are available, then a cassette from another loadlock can be used as a source of wafers while the loadlock depicted is refilled.

While the use of a single robot with the capability of handling two or more wafers at a time is preferred, in some embodiments multiple robots are used. This is advantageous for situations in which the chambers are to be loaded at different times, for example, if two different processes are being performed, one in each of the stacked chambers.

Figure 2:
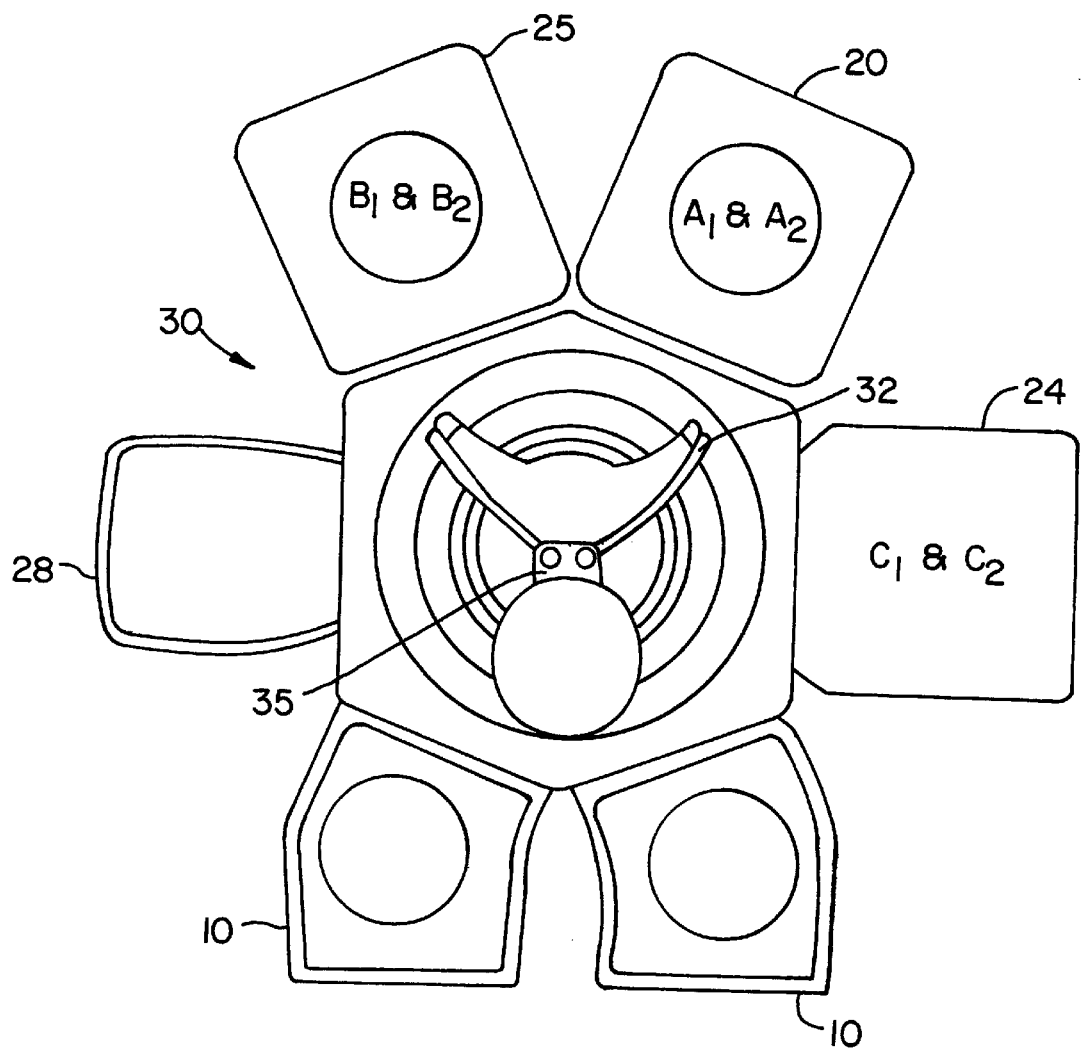
FIG. 2 is a top view of the system shown in FIG. 1.

FIG. 2 is a plan or top view of a multideck wafer processing system. FIG. 2 represents the appearance of a typical system when viewed from above. In the system shown in FIG. 2, two loadlocks 10 are provided, each with its own chamber for storing a cassette and elevating the cassette up and down to enable the wafers to be removed from the cassette by the arm 32 and supports 35. As shown the loadlocks are coupled to wafer transfer chamber 30 where the robot is situated. Coupled around the periphery of the wafer transfer chamber 30 are the desired wafer processing chambers. For example, wafer processing chambers $A_1$ and $A_2$ shown in FIG. 1 are shown near the upper portion of FIG. 2, while additional chambers 24 and 25 are shown adjoining chambers 20. The additional chambers each include a stacked pair of chambers as shown in FIG. 1. For example, chambers 25 consists of vertically arranged chambers $B_1$ and $B_2$, while the chambers 24 consists of vertically arranged chambers $C_1$ and $C_2$. Of course, more or fewer chambers, whether stacked or single, can be included as desired. Also shown in FIG. 2 is a multiwafer cool-down chamber 28 to allow the wafers to cool after being removed from the processing chambers and before being reintroduced into the cassettes in the loadlocks. Importantly, as evident from FIG. 2, the footprint of the overall wafer processing system depicted is the same size as those systems where only a single tier of wafer processing chamber is used. Thus, as shown by FIG. 2, six processing chambers are provided in the same area of fab floor space as a prior art system with three processing chambers.

The use of two loadlocks as depicted in FIG. 2 enables one loadlock to be an active loadlock for use by the processing equipment, while a new supply of wafers is introduced into the other loadlock and the pressure lowered to the desired level. By the time a first cassette is completely processed from the first loadlock, a second cassette in the second loadlock will be ready for processing. In this manner, the completed first cassette can be removed from the first loadlock, and a third cassette introduced for processing. This improves the efficiency of the system.

Figure 3:
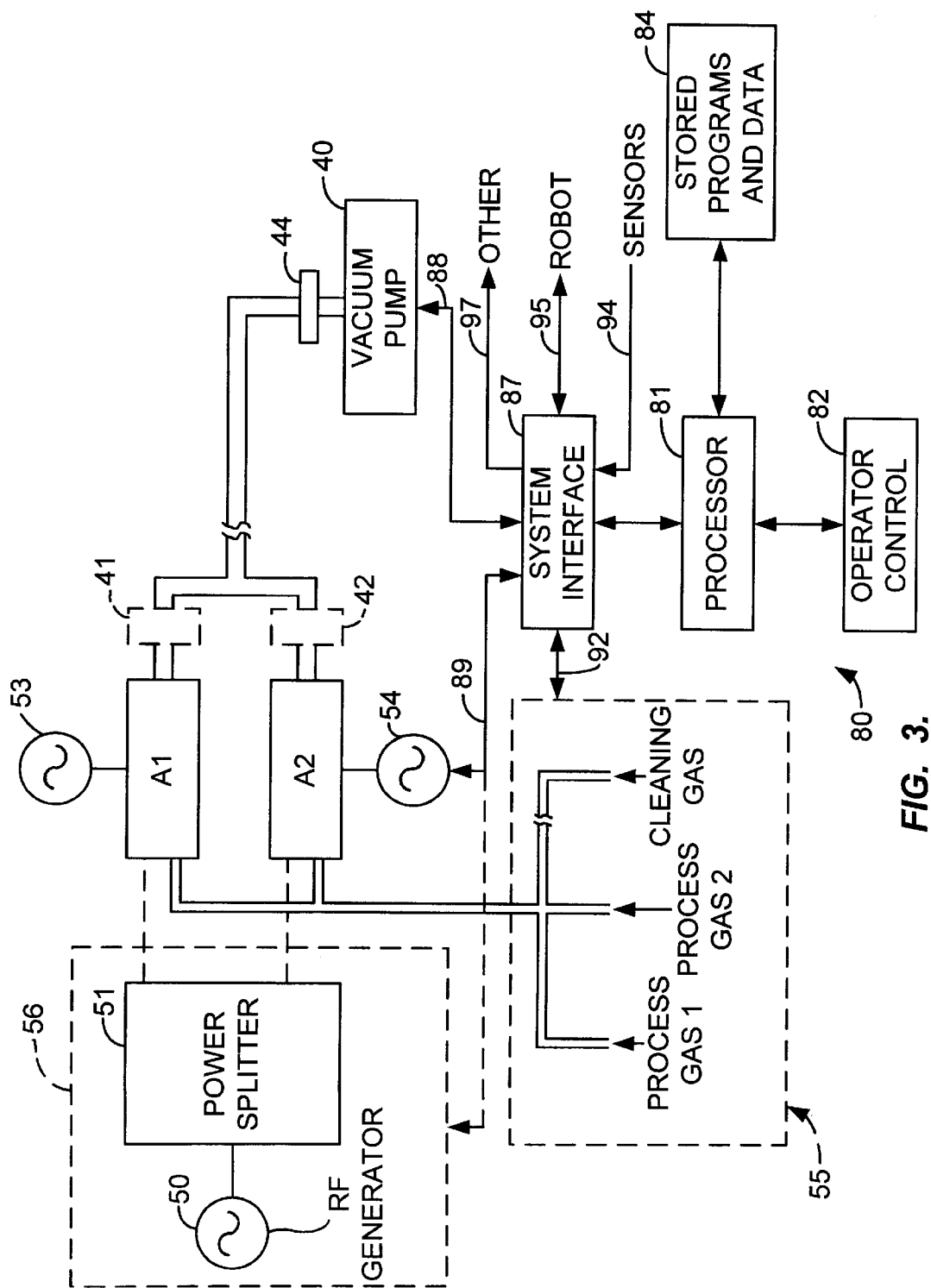
FIG. 3 is a schematic diagram illustrating a typical vacuum, RF, and process gas supply system, as well as a control system, for the apparatus shown in FIGS. 1 and 2.

FIG. 3 illustrates additional aspects of the invention described herein. The use of vertically stacked multiple chamber systems enables shared use of one or more of a radio frequency system, a vacuum pumping system, a process gas system, and a control system. That is, each of these systems can be shared by the vertically arranged chambers. For example, in FIG. 3 a single vacuum pumping set 40 preferably is provided. This is coupled through a single throttle valve 44 to chambers $A_1$ and $A_2$. In another embodiment vacuum pumping set 40 is coupled through two throttle valves 41 and 42 to the two chambers $A_1$ and $A_2$, one above the other. To illustrate this alternative embodiment, the two throttle valves are shown schematically with dashed lines.

To improve operation, in the preferred embodiment separate RF generators 53 and 54 are used, one for each chamber. In an alternate embodiment, illustrated with dashed line 56, a single RF generator 50 is coupled through a power splitter 51 to each of the two chambers. Furthermore, a single supply 55 for the deposition or other process gas, as well as the cleaning gas, is provided and shared by both chambers. In prior art wafer processing systems, a single RF generator was typically used for each chamber, as was a single vacuum pumping set, and a single source of process gases. The ability to share some or all of these support services is advantageous.

Depicted schematically in FIG. 3 is a representation of a control system 80 for controlling the multideck single wafer processing system. Control system 80 includes a processor 81 coupled to an operator control system 82 and to a memory 84. Processor 81 and operator control system 82 consists of known components. The operator of the wafer processing system typically enters commands using, for example, a keyboard or other apparatus in the operator control system 82. Under direction of these commands the processor 81 will use the programs and data stored in memory 84 to carry out desired wafer processing steps.

In the preferred embodiment the processor 81 is connected to supply commands to the wafer processing system through a suitable interface 87. Interface 87 is connected, in turn, to the vacuum system through a bus or other connection 88 which enables the processor 81 to provide desired instructions to the vacuum system and receive information from it. Other similar interconnections 89, 92 and 95 enable the processor to control the RF generator(s), the process gas system, and the robot handling wafer movement. Of course, sensors may provide information to the processor via connections 94 to the system interface. In addition, other desired equipment may be coupled to the processor 81 by a suitable connection 97 to the system interface. In the manner depicted, the control system 80 is able to control the operations of the multideck single wafer processing system.

Figure 4:
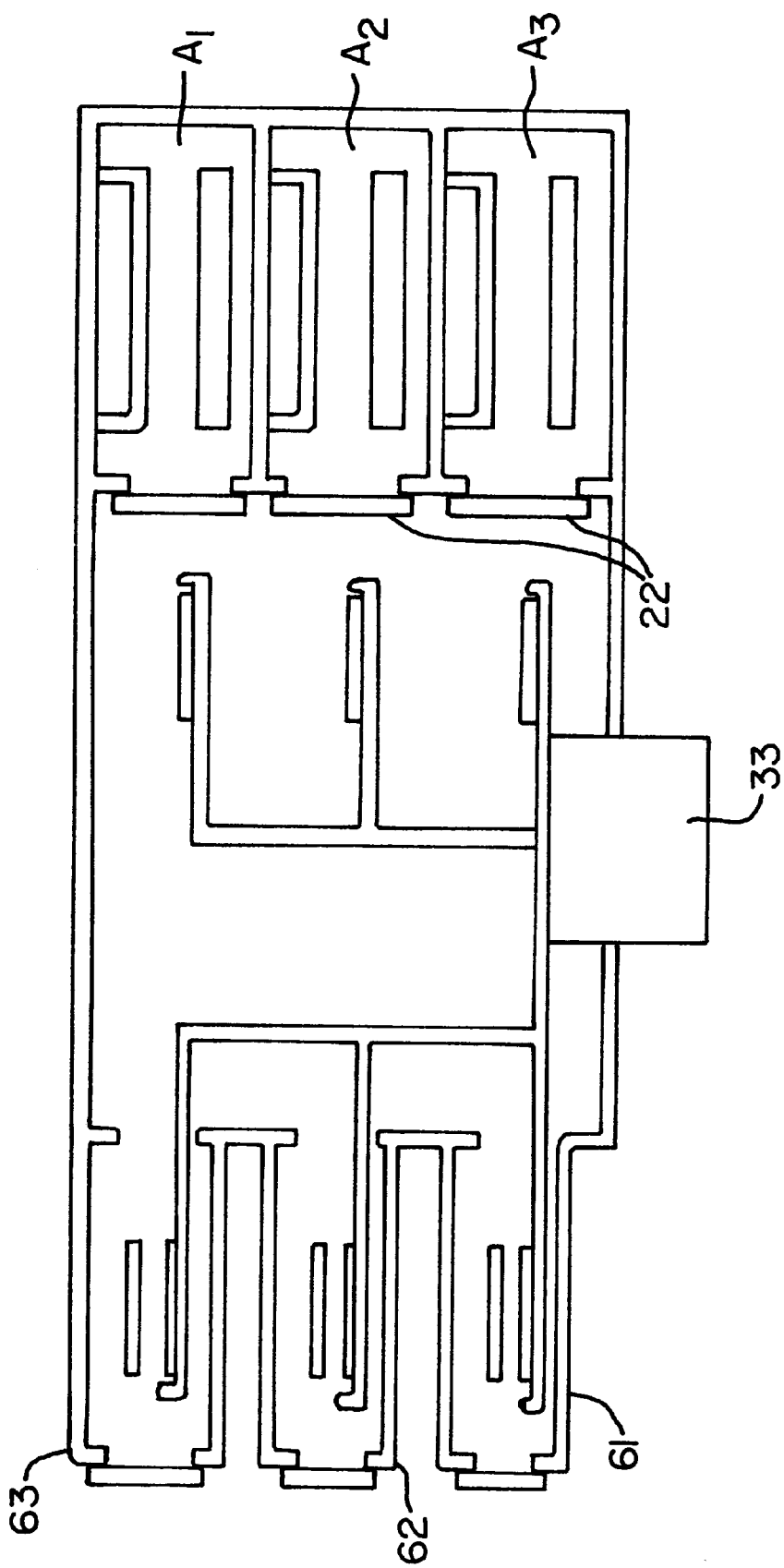
FIG. 4 is a cross-sectional view of a multideck system in which three chambers are vertically arranged.

FIG. 4 illustrates another embodiment of the invention in which three processing chambers $A_1$, $A_2$ and $A_3$ are disposed one above the other. The components shown in FIG. 4 correspond to those described in conjunction with FIG. 1, but an additional processing chamber $A_3$ is provided. In addition, to reduce the pumping and venting time required by large loadlocks, a group of smaller loadlocks 61, 62, 63 is used. These loadlocks contain fewer wafers than a cassette, for example, two wafers. During the processing of the second wafer, the first wafer cools and is returned to a cassette, and a third wafer introduced. The use of smaller multiple loadlocks permits servicing by an external robot (not shown) and cassettes because the smaller loadlock chamber can be more quickly pumped down to the required low pressure level. In this way cooling of the wafers occurs in the individual loadlocks without changing the throughput of the system.

One concern in a multideck system, such as described in conjunction with the figures herein, is servicing of the chambers. In typical wafer processing chambers, the top of the chamber can be removed to enable cleaning of the interior of the chamber. While this is feasible with the top chamber in a two-level system or three-level system, it is not feasible with the lower chamber. As a result, in the preferred embodiment of the system described herein, the chambers are hinged so that the top chamber can be pivoted or moved out from above the lower chamber, enabling both to be serviced. Alternatively, the chambers can be made removable from the wafer transfer chamber. Typically, the multideck chambers will be bolted, or otherwise connected to the wafer transfer chamber, and positioned on rails, swing arms, hinges or other supporting means to be moved away from the wafer transfer chamber. Depending upon the operational requirements, spare processing chambers may be substituted for the chambers being cleaned, or the chambers may be removed, cleaned, and then returned.

The system of this invention enables the overall throughput of a single wafer processing system to be doubled or tripled, or further increased, yet consumes no additional floor area in the fab. Furthermore, the system enables a group of single wafer processing chambers to share gas lines, power supply, vacuum pumps, and other expensive equipment. At the same time, when used with single wafer processing equipment, the system of this invention permits processing of individual wafers, resulting in a more optimal process condition, with only one wafer being ruined if a problem occurs.

The system described has many advantages over prior art wafer processing systems, and well as prior art multiple wafer processing systems in which multiple wafers are processed in a single chamber. Handling two or more wafers at once at least doubles the throughput without increasing the footprint of the overall system. Using the RF, gas delivery, and vacuum splitting techniques provides a lower cost per chamber, yet at the same time provides the quality and reliability of single wafer processing.

The foregoing description of the preferred embodiments of the invention has been provided for the purposes of understanding of the invention. The description is not intended to be exhaustive, or to limit the invention to precise forms described. For example, although the preferred embodiment provides for processing of a single wafer at a time in each processing chamber, groups of wafers may be processed simultaneously in a single chamber without departing from the scope of the invention. Numerous modifications and variations are possible in view of the teachings above.

What is claimed is:

1. A system for treating semiconductor wafers comprising:
   a wafer storage mechanism for storing a plurality of wafers;
   at least one set of wafer processing chambers having at least a first wafer processing chamber and a second wafer processing chamber stacked one above the other, the first wafer processing chamber for carrying out a first semiconductor fabrication process consisting of a chemical vapor deposition process, a plasma vapor deposition process, or an epitaxial deposition process, and the second wafer processing chamber for carrying out a second semiconductor fabrication process different from the first semiconductor fabrication process consisting of a chemical vapor deposition process, a plasma vapor deposition process, or an epitaxial deposition process;
   a wafer transfer chamber coupled to the wafer storage mechanism and to the first wafer processing chamber and the second wafer processing chamber to enable wafers from the wafer storage mechanism to be transported to the first wafer processing chamber and the second wafer processing chamber; and wherein the first semiconductor fabrication process is carried out asynchronously with respect to the second process.

2. A system for treating semiconductor wafers as in claim 1 wherein the wafer transport chamber comprises a mechanism capable of moving at least two wafers together from the wafer storage mechanism and placing one of the wafers in each of the first and second wafer processing chambers.

3. A system for treating semiconductor wafers as in claim 2 wherein each of the first and second wafer processing chambers comprises a chamber for processing only a single wafer at a time.

4. A system for treating semiconductor wafers as in claim 2 wherein each of the first and second wafer processing chambers comprises a chamber for processing more than one wafer at a time.

5. A system as in claim 1 wherein the first and second wafer processing chambers are coupled to a pumping system for establishing a desired pressure within each of the chambers.

6. A system as in claim 5 wherein the pumping system comprises a common vacuum pump set shared by the first and second wafer processing chambers.

7. A system as in claim 1 wherein the first and second wafer processing chambers are each coupled to a power supply for creating an electromagnetic field within each of the chambers.

8. A system as in claim 7 wherein a common radio frequency generator is shared by the first and second wafer processing chambers.

9. A system as in claim 1 wherein the first and second wafer processing chambers are coupled to a gas system for supplying gases to each of the chambers.

10. A system as in claim 9 wherein a common gas supply is shared by the first and second wafer processing chambers.

11. A system as in claim 1 wherein the wafer storage mechanism comprises at least two loadlock chambers, each for holding at least two wafers therein.

12. A system as in claim 11 wherein the wafer storage mechanism comprises a pair of loadlock chambers, each for holding a cassette containing wafers.

13. A system as in claim 1 further comprising an additional chamber coupled to the wafer transfer chamber, the additional chamber for temporarily storing wafers after processing to allow them to cool to a lower temperature.

14. A system for treating semiconductor wafers as in claim 1 further comprising:
 a second set of wafer processing chambers having at least a third wafer processing chamber and a fourth wafer processing chamber stacked one above the other, and spaced apart from the at least one set of wafer processing chambers;
 the third wafer processing chamber and the fourth wafer processing chamber being coupled to the wafer transfer chamber to enable wafers from the wafer storage mechanism to be transported to the third wafer processing chamber and the fourth wafer processing chamber.

15. A system for processing semiconductor wafers comprising:
 a loadlock chamber for storing a plurality of wafers to be processed;
 at least two sets of processing chambers, each set including at least two wafer processing chambers stacked one above the other, each chamber including a separate system for processing wafers therein;
 a wafer transfer chamber including a wafer handling system for transporting wafers from the loadlock chamber to the at least two sets of processing chambers, the wafer handling system being capable of moving at least two wafers simultaneously from the loadlock chamber to the processing chambers; and
 wherein a different wafer processing operation consisting of a chemical vapor deposition process, a plasma vapor deposition process, or an epitaxial deposition process, may be carried out in each processing chamber in a set asynchronously with respect to each other processing chamber.

16. A system for processing semiconductor wafers as in claim 15 wherein the wafer handling system comprises a robot for taking at least two wafers from the loadlock chamber and placing separate ones of the at least two wafers into separate ones of the processing chambers in a single operation.

17. A system for treating semiconductor wafers as in claim 16 wherein each of the processing chambers comprises a chamber for processing only a single wafer.

18. A system as in claim 15 wherein each of the processing chambers are coupled to a pumping system for establishing a desired pressure within each of the chambers.

19. A system as in claim 18 wherein the pumping system comprises a common vacuum pumping set shared by the processing chambers.

20. A system for treating semiconductor wafers as in claim 19 wherein each of the chambers comprises a chamber for processing only a single wafer.

21. A system as in claim 15 wherein each of the processing chambers is coupled to a common power supply for creating an electromagnetic field within each of the chambers.

22. A system as in claim 21 wherein each of the processing chambers are coupled to a gas system for supplying gases to each of the chambers, and a common gas supply is shared by each of the wafer processing chambers.

23. A system as in claim 15 wherein each of the processing chambers is coupled to a separate power supply for creating an electromagnetic field within each of the chambers.

24. A method for processing more than one wafer simultaneously comprising:
 providing at least two sets of two wafer processing chambers, each set including one processing chamber disposed above another processing chamber;
 storing a plurality of wafers in a wafer storage mechanism;
 removing at least two wafers from the wafer storage mechanism;
 placing the at least two wafers, each in a separate process chamber;
 performing a first semiconductor fabrication process consisting of a chemical vapor deposition process, a plasma vapor deposition process, or an epitaxial deposition process on one of the wafers to change its condition;
 performing a second semiconductor fabrication process consisting of a chemical vapor deposition process, a plasma vapor deposition process, or an epitaxial deposition process on another of the wafers to change its condition, the second process having different conditions from the first process;
 removing at least one of the at least two wafers from its corresponding process chamber; and
 returning the wafers removed in the preceding step to the wafer storage mechanism.

25. A method for treating semiconductor wafers as in claim 24 wherein:
the step of removing comprises using a robot mechanism to move at least two wafers together from the wafer storage mechanism; and
the step of placing one of the wafers in each of the chambers comprises using the same robot mechanism to place the wafers.

26. A method as in claim 24 wherein the wafer processing chambers are coupled to a pumping system and the method further comprises, following the step of placing, a step of changing the pressure within at least one set of the chambers.

27. A method as in claim 24 wherein the wafer processing chambers are coupled to a gas system for supplying gases to each of the chambers, and the method further comprises, during the step of performing a process on the wafers to change their condition, a step of providing the gas to at least one of the processing chambers.

28. A method as in claim 27 wherein the step of providing the gas comprises providing gas from a common gas supply to each of the processing chambers stacked one above the other.

29. A method for processing semiconductor wafers comprising:
storing a plurality of wafers in a loadlock chamber;
providing at least two pairs of processing chambers, each pair including one chamber stacked above another chamber;
transporting at least two wafers from the loadlock chamber, one to each of the chambers in at least one of the pairs of processing chambers; and
performing a different semiconductor fabrication process consisting of a chemical vapor deposition process, a plasma vapor deposition process, or an epitaxial deposition process on each of the wafers.

30. A method for processing semiconductor wafers as in claim 29 wherein the step of transporting at least two wafers from the loadlock chamber comprises using a robot to transfer the wafers.

31. A method as in claim 29 wherein the method further comprises establishing a lower than atmospheric pressure within each of the chambers.

32. A method as in claim 31 wherein the step of establishing a lower than atmospheric pressure within each of the chambers comprises using a common vacuum pumping set to pump gas from each of the chambers.

33. A method as in claim 29 wherein the method further comprises coupling each of the at least two pairs of processing chambers through a power splitter to a common power supply for creating an electromagnetic field within each of the chambers.

34. A method as in claim 33 further comprising coupling each of the at least two pairs of processing chambers to a common gas system for supplying gases to each of the chambers.

35. In a system for treating semiconductor wafers which includes a wafer storage mechanism for storing a plurality of wafers, at least two sets of processing chambers, each having at least two chambers stacked one above the other, and a wafer transfer chamber coupled to the wafer storage mechanism and to the at least two sets of chambers to enable wafers from the wafer storage mechanism to be transported to any desired chamber, a stored program for controlling the system comprising:
a first sequence of instructions from a computer program for controlling the movement of wafers from the wafer storage mechanism to the at least two sets of chambers;
a second sequence of instructions from a computer program for controlling the at least two sets of processing chambers to cause them to carry out a desired semiconductor fabrication operation consisting of a chemical vapor deposition process, a plasma vapor deposition process, or an epitaxial deposition process, the desired semiconductor fabrication operation having different parameters for one processing chamber than for another; and
a third sequence of instructions from a computer program for controlling the movement of wafers from the at least two sets of processing chambers to the wafer storage mechanism.

36. A system for treating semiconductor wafers comprising:
a wafer storage mechanism for storing a plurality of wafers in a cassette;
at least one set of wafer processing chambers having at least two wafer processing chambers each for performing a different semiconductor manufacturing process consisting of a chemical vapor deposition process, a plasma vapor deposition process, or an epitaxial deposition process, stacked one above the other; and
a wafer transfer chamber coupled to the wafer storage mechanism and to the at least two chambers to enable wafers from the wafer storage mechanism to be transported to the at least two chambers.

37. A system for treating semiconductor wafers as in claim 36 wherein the wafer transport chamber comprises a mechanism capable of moving at least two wafers together from the wafer storage mechanism and placing one of the wafers in each of the at least two wafer processing chambers.

38. A system as in claim 36 wherein the wafer storage mechanism comprises at least two loadlock chambers, each for holding at least one cassette of wafers therein.

39. A system as in claim 36 further comprising an additional chamber coupled to the wafer transfer chamber, the additional chamber for temporarily storing wafers after processing to allow them to cool to a lower temperature.

40. A system for processing semiconductor wafers comprising:
a loadlock chamber for storing a plurality of wafers to be processed in a cassette;
at least one pair of processing chambers stacked one above the other, each chamber including a separate system for processing wafers therein using a different process than the other chamber, the process consisting of a chemical vapor deposition process, a plasma vapor deposition process, or an epitaxial deposition process; and
a wafer transfer chamber including a wafer handling system for removing wafers from the cassette in the loadlock chamber and transporting those wafers to the at least one pair of processing chambers, the wafer handling system being capable of moving at least two wafers simultaneously from the loadlock chamber to the processing chambers.

41. A system for processing semiconductor wafers as in claim 40 wherein the wafer handling system comprises a robot for taking at least two wafers from the cassette in the loadlock chamber and placing separate ones of the at least two wafers into separate ones of the at least one pair of processing chambers in a single operation.

42. A method for processing more than one wafer simultaneously comprising:

providing at least two wafer processing chambers, one disposed above the other;

storing a plurality of wafers in a cassette in a wafer storage mechanism;

removing at least two wafers from the cassette in the wafer storage mechanism;

placing at least one of the at least two wafers in a corresponding process chamber;

performing a different semiconductor fabrication process the process consisting of a chemical vapor deposition process, a plasma vapor deposition process, or an epitaxial deposition process on each of the wafers to change its condition;

removing at least one of the at least two wafers from its corresponding process chamber; and later returning the wafers removed in the preceding step to the cassette in the wafer storage mechanism.

43. A method as in claim 42 wherein the step of removing comprises using a robot mechanism to move at least two wafers at the same time from the cassette in the wafer storage mechanism.

44. In a system for treating semiconductor wafers which includes a wafer storage mechanism for storing a plurality of wafers in at least one cassette, at least one set of processing chambers having at least two chambers stacked one above the other, and a wafer transfer chamber coupled to the wafer storage mechanism and to the at least two chambers to enable wafers from the cassette in the wafer storage mechanism to be transported to the at least two chambers, a stored program for controlling the system comprising:

a first sequence of instructions from a computer program for controlling the movement of wafers from the cassette in the wafer storage mechanism to the at least two chambers;

a second sequence of instructions from a computer program for controlling the at least one set of processing chambers to cause them to carry out different desired semiconductor fabrication operations consisting of a chemical vapor deposition process, a plasma vapor deposition process, or an epitaxial deposition process; and a third sequence of instructions from a computer program for controlling the movement of the wafers after performance of the desired semiconductor fabrication operation from the at least one set of processing chambers to the cassette in the wafer storage mechanism.

* * * * *